(12) United States Patent
Hopkins et al.

(10) Patent No.: US 12,426,269 B2
(45) Date of Patent: Sep. 23, 2025

(54) BARRIER STRUCTURE FOR PREVENTING ETCHING TO CONTROL CIRCUITRY

(71) Applicant: Micron Technology, Inc., Boise, ID (US)

(72) Inventors: John Hopkins, Meridian, ID (US); Jordan D. Greenlee, Boise, ID (US); Daniel Billingsley, Boise, ID (US); Alyssa N. Scarbrough, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 715 days.

(21) Appl. No.: 17/748,924

(22) Filed: May 19, 2022

(65) Prior Publication Data

US 2023/0380172 A1    Nov. 23, 2023

(51) Int. Cl.
*H10B 43/40* (2023.01)
*H10B 41/41* (2023.01)

(52) U.S. Cl.
CPC ............. *H10B 43/40* (2023.02); *H10B 41/41* (2023.02)

(58) Field of Classification Search
CPC ................................ H10B 43/40; H10B 41/41
See application file for complete search history.

(56) References Cited

U.S. PATENT DOCUMENTS 11,049,568 B1 *  6/2021  Yada ..................... H10B 43/10

\* cited by examiner

*Primary Examiner* — Wasiul Haider
(74) *Attorney, Agent, or Firm* — Holland & Hart LLP

(57) ABSTRACT

Methods, systems, and devices for a barrier structure for preventing removal of, such as etching to, control circuitry are described. A memory device may include control circuitry over a substrate and for accessing a memory array and contact regions configured to couple with the control circuitry. The memory device may include barrier regions between respective contact regions that includes a barrier material. The memory device may include a stack of layers over the barrier region and the contact regions that is associated with the memory array, and the barrier material may prevent a removal (e.g., an etch) through the stack of layers and at least partially between contact regions from extending to the control circuitry.

20 Claims, 7 Drawing Sheets

BARRIER STRUCTURE FOR PREVENTING ETCHING TO CONTROL CIRCUITRY

FIELD OF TECHNOLOGY

The following relates to one or more systems for memory, including a barrier structure for preventing removal of, such as etching to, control circuitry.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Figure 1:
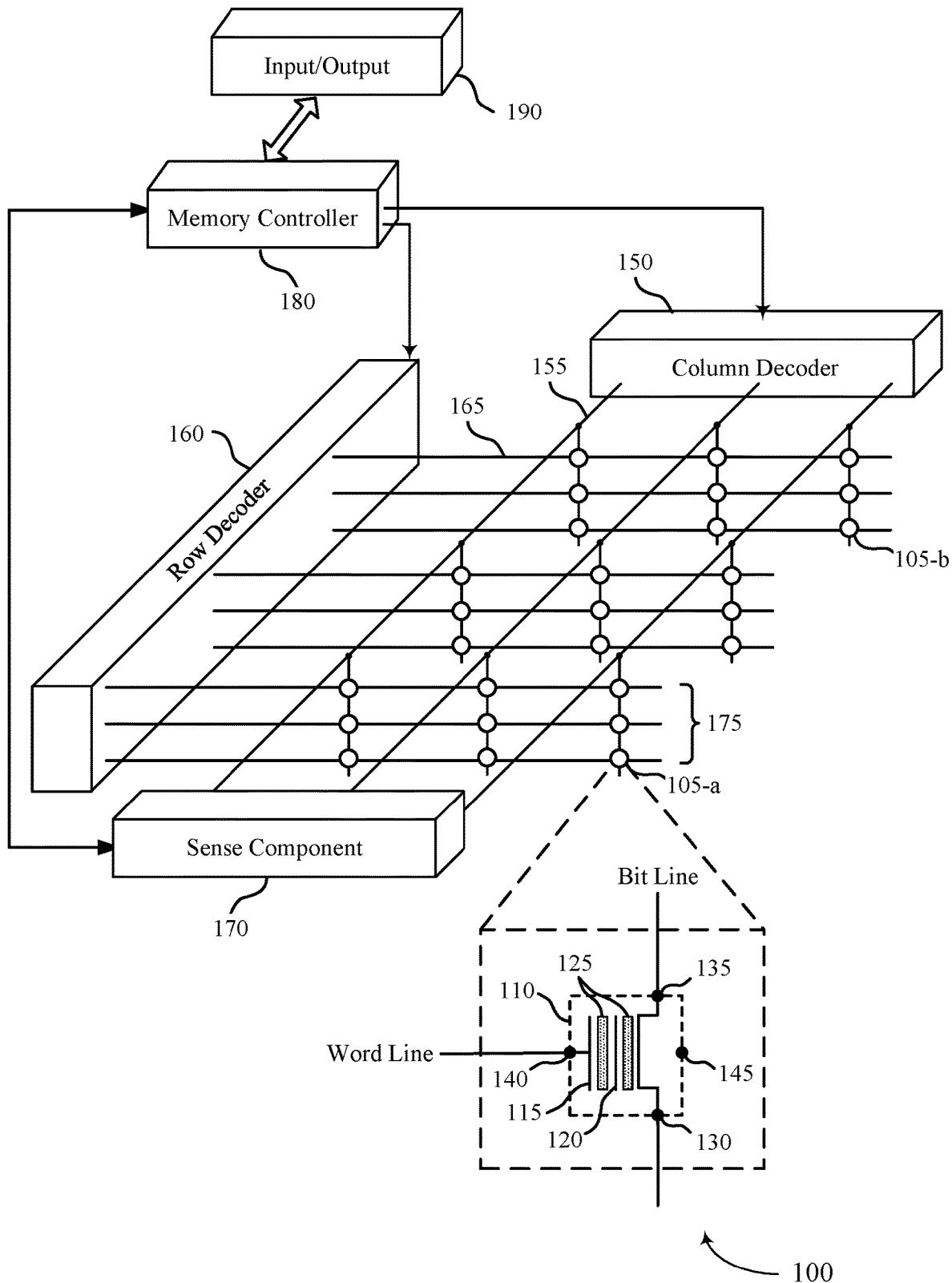
FIG. 1 illustrates an example of a system that supports a barrier structure for preventing removal of, such as etching to, control circuitry in accordance with examples as disclosed herein.

Memory devices may include various arrangements of memory arrays and supporting control circuitry formed over (e.g., directly over, over one material or layer and one or more other materials or layers, in contact with) a substrate. For example, a memory device may include control circuitry (e.g., substrate-based control circuitry, complementary metal oxide semiconductor (CMOS) circuitry) and one or more contact regions (e.g., a contact island) configured to couple material layers associated with a memory array (e.g., components formed on, from, or within the material layers) to the control circuitry. The control circuitry and the one or more contact regions may support accessing or operating the memory array and may be located below the material layers, which may refer to a location that is at least in part between the material layers and the substrate (e.g., in a direction orthogonal to the substrate, in a vertical direction). In some manufacturing operations, portions of the contact regions or the material layers may be removed (e.g., by an etching operation). For example, a manufacturing operation may include a removal (e.g., an etch) through the material layers and to a given contact region (e.g., to a metal contact of the contact region, through one or more layers of the contact region and over the metal contact), thereby creating a cavity. In some examples, the cavity may support the formation of interconnect circuitry (e.g., thru array vias (TAVs), for example, for coupling the control circuitry with other components of the memory device (e.g., access circuitry, decoding circuitry). In some examples, the cavity may support subsequent removal (e.g., etching) and/or deposition operations, for example, to form memory cells, access circuitry, and/or decoding circuitry, among other components, at (e.g., within) the material layers.

In some cases, respective contact regions may be separated by a dielectric material (e.g., an oxide material) that physically and/or electrically isolates respective contact regions from each other and protects the control circuitry over which the dielectric material is formed. In some examples, the dielectric material may be a material that is removed if exposed to the removal (e.g., an etch) through the material layers, such as when performing the removal using hot phosphoric acid. As such, misalignments or precision tolerance errors may cause the removing (e.g., etching) to at least partially miss the contact regions, thereby unintentionally removing the dielectric material and adversely contacting or exposing the control circuitry. As a result, subsequent removal or deposition operations may reach the exposed control circuitry, which may cause damage or degradation to the control circuitry, connection failure of components of the control circuitry, or unintentional shorting, among other disadvantages.

In accordance with examples as disclosed herein, a memory device may include a barrier region located between respective contact regions and include a barrier material resistant to removal operations (e.g., resistant to etching operations that use hot phosphoric acid). For example, the barrier material will act as a removal stop (e.g. an etching stop) or decelerator to prevent an etchant from removing from contacting or exposing control circuitry over which the barrier region and contact regions are located. In some examples, the barrier material may be included in the barrier region as a material filling at least some of, if not the entirety of, the barrier region (e.g., the entirety of the space between the contact regions). In some examples, the barrier region may include a dielectric material, and the barrier material may form a material section (e.g., a layer, a liner) between dielectric material and the contact regions. Including the barrier material in the barrier region prevents removing (e.g., by etching) between the contact regions that would otherwise result from misalignment or precision tolerance errors during manufacturing operations, thereby protecting the control circuitry, preventing shorting, and ensuring normal operation of the memory device, among other benefits.

Features of the disclosure are initially described in the context of a memory device and a memory architecture as described with reference to FIGS. 1 and 2. Features of the disclosure are additionally described in the context of memory architectures and processing steps with reference to FIGS. 3 through 5D. These and other features of the disclosure are further illustrated by and described in the context of a flowchart that relates to a barrier structure for preventing removal of, such as etching to, control circuitry with reference to FIG. 6.

FIG. 1 illustrates an example of a memory device 100 that supports a barrier structure for preventing removal of, such as etching to, control circuitry in accordance with examples as disclosed herein. FIG. 1 is an illustrative representation of various components and features of the memory device 100. As such, the components and features of the memory device 100 are shown to illustrate functional interrelationships, and not necessarily physical positions within the memory device 100. Further, although some elements included in FIG. 1 are labeled with a numeric indicator, some other corresponding elements are not labeled, even though they are the same or would be understood to be similar, in an effort to increase visibility and clarity of the depicted features.

The memory device 100 may include one or more memory cells, such as memory cell 105-a and memory cell 105-b. In some examples, a memory cell 105 may be a NAND memory cell, such as in the blow-up diagram of memory cell 105-a. Each memory cell 105 may be programmed to store a logic value representing one or more bits of information. In some examples, a single memory cell 105—such as a memory cell 105 configured as a single-level cell (SLC)—may be programmed to one of two supported states and thus may store one bit of information at a time (e.g., a logic 0 or a logic 1). In some other examples, a single memory cell 105—such a memory cell 105 configured as a multi-level cell (MLC), a tri-level cell (TLC), a quad-level cell (QLC), or other type of multiple-level memory cell 105—may be programmed to one or more than two supported states and thus may store more than one bit of information at a time. In some cases, a multiple-level memory cell 105 (e.g., an MLC memory cell, a TLC memory cell, a QLC memory cell) may be physically different than an SLC cell. For example, a multiple-level memory cell 105 may use a different cell geometry or may be fabricated using different materials. In some examples, a multiple-level memory cell 105 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

In some NAND memory arrays, each memory cell 105 may be illustrated as a transistor that includes a charge trapping structure (e.g., a floating gate, a replacement gate, a dielectric material) for storing an amount of charge representative of a logic value. For example, the blow-up in FIG. 1 illustrates a NAND memory cell 105-a that includes a transistor 110 (e.g., a metal-oxide-semiconductor (MOS) transistor) that may be used to store a logic value. The transistor 110 may include a control gate 115 and a charge trapping structure 120 (e.g., a floating gate, a replacement gate), where the charge trapping structure 120 may, in some examples, be between two portions of dielectric material 125. The transistor 110 also may include a first node 130 (e.g., a source or drain) and a second node 135 (e.g., a drain or source). A logic value may be stored in transistor 110 by storing (e.g., writing) a quantity of electrons (e.g., an amount of charge) on the charge trapping structure 120. An amount of charge to be stored on the charge trapping structure 120 may depend on the logic value to be stored. The charge stored on the charge trapping structure 120 may affect the threshold voltage of the transistor 110, thereby affecting the amount of current that flows through the transistor 110 when the transistor 110 is activated (e.g., when a voltage is applied to the control gate 115, when the memory cell 105-a is read). In some examples, the charge trapping structure 120 may be an example of a floating gate or a replacement gate that may be part of a two-dimensional (2D) NAND structure. For example, a 2D NAND array may include multiple control gates 115 and charge trapping structures 120 arranged around a single channel (e.g., a horizontal channel, a vertical channel, a columnar channel, a pillar channel).

A logic value stored in the transistor 110 may be sensed (e.g., as part of a read operation) by applying a voltage to the control gate 115 (e.g., to control node 140, via a word line 165) to activate the transistor 110 and measuring (e.g., detecting, sensing) an amount of current that flows through the first node 130 or the second node 135 (e.g., via a bit line 155). For example, a sense component 170 may determine whether an SLC memory cell 105 stores a logic 0 or a logic 1 in a binary manner (e.g., based on a presence or absence of a current through the memory cell 105 when a read voltage is applied to the control gate 115, based on whether the current is above or below a threshold current). For a multiple-level memory cell 105, a sense component 170 may determine a logic value stored in the memory cell 105 based on various intermediate threshold levels of current when a read voltage is applied to the control gate 115, or by applying different read voltages to the control gate and evaluating different resulting levels of current through the transistor 110, or various combinations thereof. In one example of a multiple-level architecture, a sense component 170 may determine the logic value of a TLC memory cell 105 based on eight different levels of current, or ranges of current, that define the eight potential logic values that could be stored by the TLC memory cell 105.

An SLC memory cell 105 may be written by applying one of two voltages (e.g., a voltage above a threshold or a voltage below a threshold) to memory cell 105 to store, or not store, an electric charge on the charge trapping structure 120 and thereby cause the memory cell 105 store one of two possible logic values. For example, when a first voltage is applied to the control node 140 (e.g., via a word line 165) relative to a bulk node 145 (e.g., a body node) for the transistor 110 (e.g., when the control node 140 is at a higher voltage than the bulk), electrons may tunnel into the charge trapping structure 120. Injection of electrons into the charge trapping structure 120 may be referred to as programming the memory cell 105 and may occur as part of a write operation. A programmed memory cell may, in some cases, be considered as storing a logic 0. When a second voltage is applied to the control node 140 (e.g., via the word line 165) relative to the bulk node 145 for the transistor 110 (e.g., when the control node 140 is at a lower voltage than the bulk node 145), electrons may leave the charge trapping structure 120. Removal of electrons from the charge trapping structure 120 may be referred to as erasing the memory cell 105 and may occur as part of an erase operation. An erased memory cell may, in some cases, be considered as storing a logic 1. In some cases, memory cells 105 may be programmed at a page level of granularity due to memory cells 105 of a page sharing a common word line 165, and memory cells 105 may be erased at a block level of granularity due to memory cells 105 of a block sharing commonly biased bulk nodes 145.

In contrast to writing an SLC memory cell 105, writing a multiple-level (e.g., MLC, TLC, or QLC) memory cell 105 may involve applying different voltages to the memory cell 105 (e.g., to the control node 140 or bulk node 145 thereof) at a finer level of granularity to more finely control the amount of charge stored on the charge trapping structure 120, thereby enabling a larger set of logic values to be represented. Thus, multiple-level memory cells 105 may provide greater density of storage relative to SLC memory cells 105 but may, in some cases, involve narrower read or write margins or greater complexities for supporting circuitry.

A charge-trapping NAND memory cell 105 may operate similarly to a floating-gate NAND memory cell 105 but, instead of or in addition to storing a charge on a charge trapping structure 120, a charge-trapping NAND memory cell 105 may store a charge representing a logic state in a dielectric material between the control gate 115 and a channel (e.g., between a first node 130 and a second node 135). Thus, a charge-trapping NAND memory cell 105 may include a charge trapping structure 120, or may implement charge trapping functionality in one or more portions of dielectric material 125, among other configurations.

In some examples, each page of memory cells 105 may be connected to a corresponding word line 165, and each column of memory cells 105 may be connected to a corresponding bit line 155 (e.g., digit line). Thus, one memory cell 105 may be located at the intersection of a word line 165 and a bit line 155. This intersection may be referred to as an address of a memory cell 105. In some cases, word lines 165 and bit lines 155 may be substantially perpendicular to one another, and may be generically referred to as access lines or select lines.

In some cases, a memory device 100 may include a three-dimensional (3D) memory array, where multiple 2D memory arrays may be formed on top of one another. In some examples, such an arrangement may increase the quantity of memory cells 105 that may be fabricated on a single die or substrate as compared with one dimensional (1D) arrays, which, in turn, may reduce production costs, or increase the performance of the memory array, or both. In the example of FIG. 1, memory device 100 includes multiple levels (e.g., decks, layers, planes, tiers) of memory cells 105. The levels may, in some examples, be separated by an electrically insulating material. Each level may be aligned or positioned so that memory cells 105 may be aligned (e.g., exactly aligned, overlapping, or approximately aligned) with one another across each level, forming a memory cell stack 175. In some cases, memory cells aligned along a memory cell stack 175 may be referred to as a string of memory cells 105 (e.g., as described with reference to FIG. 2).

Accessing memory cells 105 may be controlled through a row decoder 160 and a column decoder 150. For example, the row decoder 160 may receive a row address from the memory controller 180 and activate an appropriate word line 165 based on the received row address. Similarly, the column decoder 150 may receive a column address from the memory controller 180 and activate an appropriate bit line 155. Thus, by activating one word line 165 and one bit line 155, one memory cell 105 may be accessed. Upon accessing, a memory cell 105 may be read (e.g., sensed) by sense component 170. For example, the sense component 170 may be configured to determine the stored logic value of a memory cell 105 based on a signal generated by accessing the memory cell 105. The signal may include a current, a voltage, or both a current and a voltage on the bit line 155 for the memory cell 105 and may depend on the logic value stored by the memory cell 105. The sense component 170 may include various circuitry (e.g., transistors, amplifiers) configured to detect and amplify a signal (e.g., a current or voltage) on a bit line 155. The logic value of memory cell 105 as detected by the sense component 170 may be output via input/output component 190. In some cases, a sense component 170 may be a part of a column decoder 150 or a row decoder 160, or a sense component 170 may otherwise be connected to or in electronic communication with a column decoder 150 or a row decoder 160.

A memory cell 105 may be programmed or written by activating the relevant word line 165 and bit line 155 to enable a logic value (e.g., representing one or more bits of information) to be stored in the memory cell 105. A column decoder 150 or a row decoder 160 may accept data (e.g., from the input/output component 190) to be written to the memory cells 105. In the case of NAND memory, a memory cell 105 may be written by storing electrons in a charge trapping structure or an insulating layer.

A memory controller 180 may control the operation (e.g., read, write, re-write, refresh) of memory cells 105 through the various components (e.g., row decoder 160, column decoder 150, sense component 170). In some cases, one or more of a row decoder 160, a column decoder 150, and a sense component 170 may be co-located with a memory controller 180. A memory controller 180 may generate row and column address signals in order to activate a desired word line 165 and bit line 155. In some examples, a memory controller 180 may generate and control various voltages or currents used during the operation of memory device 100.

In some examples, the memory device 100 may include contact regions that include a metal material for coupling with at least some of the control circuitry of the memory device 100 (e.g., a column decoder 150, a row decoder 160, a sense component 170, a memory controller 180, access line drivers, and the like). That is, the contact regions may support the accessing of one or more memory arrays of the memory device 100 by the control circuitry by coupling the control circuitry with access circuitry, such as interconnect circuitry, access lines (e.g., word lines 165, bit lines 155), and the like. In some cases, the control circuitry and the control regions may be located over a substrate over which the one or more memory arrays are formed (e.g., between the substrate and the memory arrays). During manufacturing of the memory device 100, a manufacturing operation may include a removal (e.g., an etch) through material layers associated with the one or more memory arrays and to a given contact region, thereby creating a cavity that supports, for example, the formation of interconnect circuitry, memory cells 105, access circuitry, and/or decoding circuitry, among other components, at the material layers.

In some cases, respective contact regions may be separated by a dielectric material (e.g., an oxide material) that physically and/or electrically isolates respective contact regions from each other and protects the control circuitry over which the dielectric material is formed. In some examples, the dielectric material may be a material that is removed if exposed to the removal (e.g., etch) through the material layers, such as when performing the removal using hot phosphoric acid. As such, misalignments or precision tolerance errors may cause the removing to at least partially miss the contact regions, thereby unintentionally removing the dielectric material and contacting or exposing the control circuitry as a result. Subsequent removal (e.g., etch) or deposition operations may reach the exposed control circuitry, which may cause damage or degradation to the control circuitry, connection failure of components to the control circuitry, or unintentional shorting.

In accordance with examples as disclosed herein, the memory device 100 may include a barrier region located between respective contact regions and including a barrier material resistant to removing operations (e.g., etching using hot phosphoric acid). For example, the barrier material may act as removing stop (e.g., an etching stop) to prevent removing from contacting or exposing control circuitry over which the barrier region and the contact regions are located. Including the barrier material in the barrier region may prevent removing between the contact regions that may result from misalignment or precision tolerance errors during manufacturing operations, thereby protecting the control circuitry, preventing shorting, and ensuring normal operation of the memory device 100, among other benefits.

Figure 2:
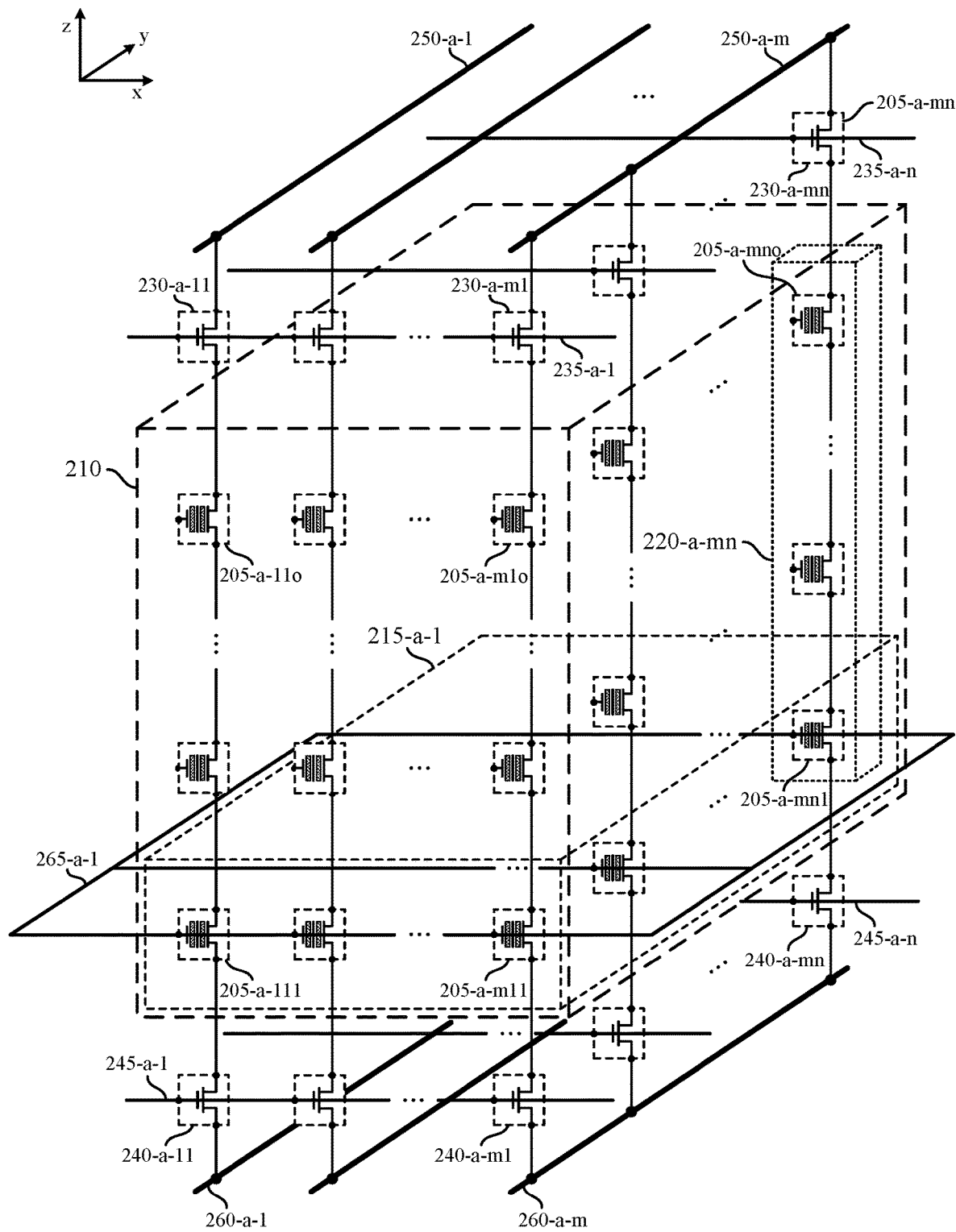
FIG. 2 illustrates an example of a memory architecture that supports a barrier structure for preventing removal of, such as etching to, control circuitry in accordance with examples as disclosed herein.

FIG. 2 illustrates an example of a memory architecture 200 that supports a barrier structure for preventing removal of, such as etching to, control circuitry in accordance with examples as disclosed herein. The memory architecture 200 may be an example of a portion of a memory device, such as a memory device 100. Although some elements of a set of elements (e.g., an array of elements) are included in FIG. 2, some elements may be omitted for the sake of visibility and clarity of the depicted elements. Moreover, although some elements included in FIG. 2 are labeled with reference numbers, some other corresponding elements are not labeled, though they are the same or would be understood to be similar. Aspects of the memory architecture 200 may be described with reference to an x-direction, a y-direction, and a z-direction of the illustrated coordinate system.

The memory architecture 200 includes a three-dimensional array of memory cells 205, which may be examples of memory cells 105 described with reference to FIG. 1 (e.g., transistors 110, NAND memory cells). In some examples, the memory cells 205 may be connected in a 3D NAND configuration. For example, the memory cells 205 may be included in a block 210, which may be arranged as a 3D array of m memory cells along the x-direction, n memory cells along the y-direction, and o memory cells along the z-direction. Each memory cell 205 may be located (e.g., addressed) in accordance with an index i along the x-direction, an index j along the y-direction, and an index k along the z-direction (e.g., for locating a memory cell 205-*a*-*ijk*). A memory device 100 may include any quantity of one or more blocks 210 in accordance with examples as disclosed herein, and different blocks 210 may be adjacent along the x-direction, along the y-direction, or along the z-direction, or any combination thereof.

In the example of memory architecture 200, the block 210 may be divided into a set of pages 215 (e.g., a quantity of o pages 215) along the z-direction, including a page 215-*a*-1 associated with memory cells 205-*a*-111 through 205-*a*-*mn*1. In some examples, each page 215 may be associated with a same word line 265, (e.g., a word line 165 described with reference to FIG. 1), which may be coupled with a control gate 115 of each of the memory cells 205 of the page 215. For example, page 215-*a*-1 may be associated with a word line 265-*a*-1, and other pages 215-*a*-*i* may be associated with a different respective word line 265-*a*-*i* (not shown). In some examples, a word line 265 in accordance with the memory architecture 200 may be implemented as planar conductor (e.g., in an xy-plane) that is coupled with each of the memory cells 205 of the page 215.

In the example of memory architecture 200, the block 210 also may be divided into a set of strings 220 (e.g., a quantity of (m×n) strings 220) in an xy-plane, including a string 220-*a*-*mn* associated with memory cells 205-*a*-*mn*1 through 205-*a*-*mno*. In some examples, each string 220 may include a set of memory cells 205 connected in series (e.g., along the z-direction, in which a drain of one memory cell 205 in the string 220 may be coupled with a source of another memory cell 205 in the string 220). In some examples, memory cells 205 of a string 220 may be implemented along a common channel, such as a pillar channel (e.g., a columnar channel, a pillar of doped semiconductor) along the z-direction. Each memory cell 205 in a string 220 may be associated with a different word line 265, such that a quantity of word lines 265 in the memory architecture 200 may be equal to the quantity of memory cells 205 in a string 220. Accordingly, a string 220 may include memory cells 205 from multiple pages 215, and a page 215 may include memory cells 205 from multiple strings 220.

In some examples, memory cells 205 may be programmed (e.g., set to a logic 0 value) and read from at the granularity of a page 215, but may not be erasable (e.g., reset to a logic 1 value) at the granularity of a page 215. For example, NAND memory may instead be erasable at a higher level of granularity, such as at the level of granularity the block 210. In some cases, a memory cell 205 may be erased before it may be re-programmed. Different memory devices may have different read, write, or erase characteristics.

In some examples, each string 220 of the block 210 may be coupled with a respective transistor 230 (e.g., a string select transistor, a drain select transistor) at one end of the string 220 (e.g., along the z-direction) and a respective transistor 240 (e.g., a source select transistor, a ground select transistor) at the other end of the string 220. In some examples, a drain of each transistor 230 may be coupled with a bit line 250 of a set of bit lines 250 associated with the block 210, where the bit lines 250 may be examples of bit lines 155 described with reference to FIG. 1. A gate of each transistor 230 may be coupled with a select line 235 (e.g., a string select line, a drain select line). Thus, a transistor 230 may be used to couple a string 220 with a bit line 250 based on applying a voltage to the select line 235, and thus to the gate of the transistors 230. Although illustrated as separate lines along the x-direction, in some examples, select lines 235 may be common to all the transistors 230 associated with the block 210 (e.g., a commonly biased string select node). For example, like the word lines 265 of the block 210, select lines 235 associated with the block 210 may, in some examples, be implemented as a planar conductor (e.g., in an xy-plane) that is coupled with each of the transistors 230 associated with the block 210.

In some examples, a source of each transistor 240 associated with the block 210 may be coupled with a source line 260 of a set of source lines 260 associated with the block 210. In some examples, the set of source lines 260 may be associated with a common source node (e.g., a ground node) corresponding to the block 210. A gate of each transistor 240 may be coupled with a select line 245 (e.g., a source select line, a ground select line). Thus, a transistor 240 may be used to couple a string 220 with a source line 260 based on applying a voltage to the select line 245, and thus to the gate of the transistors 240. Although illustrated as separate lines along the x-direction, in some examples, select lines 245 also may be common to all the transistors 240 associated with the block 210 (e.g., a commonly biased ground select node). For example, like the word lines 265 of the block 210, select lines 245 associated with the block 210 may, in some examples, be implemented as a planar conductor (e.g., in an xy-plane) that is coupled with each of the transistors 240 associated with the block 210.

To operate the memory architecture 200 (e.g., to perform a program operation, a read operation, or an erase operation on one or more memory cells 205 of the block 210), various voltages may be applied to one or more select lines 235 (e.g., to the gate of the transistors 230), to one or more bit lines 250 (e.g., to the drain of one or more transistors 230), to one or more word lines 265, to one or more select lines 245 (e.g., to the gate of the transistors 240), to one or more source lines 260 (e.g., to the source of the transistors 240), or to a bulk for the memory cells 205 (not shown) of the block 210. In some cases, each memory cell 205 of a block 210 may have a common bulk, the voltage of which may be controlled independently of bulks for other blocks 210.

In some cases, as part of a read operation for a memory cell 205, a positive voltage may be applied to the corresponding bit line 250 while the corresponding source line 260 may be grounded or otherwise biased at a voltage lower than the voltage applied to the bit line 250. Concurrently, voltages may be applied to the select line 235 and the select line 245 that are above the threshold voltages of the transistor 230 and the transistor 240, respectively, for the memory cell 205, thereby activating the transistor 230 and transistor 240 such that a channel associated with the string 220 that includes the memory cell 205 may be electrically connected to the corresponding bit line 250 and the source line 260. A channel may be an electrical path through the memory cells 205 in the string 220 (e.g., through the sources and drains of the transistors in the memory cells 205 of the string 220) that may conduct current under some operating conditions.

Concurrently, multiple word lines 265 (e.g., in some cases all word lines 265) of the block 210—except a word line 265 associated with a page 215 of the memory cell 205 to be read—may be set to a voltage (e.g., VREAD) that is higher than the threshold voltage (VT) of the memory cells 205. VREAD may cause all memory cells 205 in the unselected pages 215 be activated so that each unselected memory cell 205 in the string 220 may maintain high conductivity within the channel. In some examples, the word line 265 associated with the memory cell 205 to be read may be set to a voltage, VTarget. Where the memory cells 205 are operated as SLC memory cells, VTarget may be a voltage that is between (i) VT of a memory cell 205 in an erased state and (ii) VT of a memory cell 205 in a programmed state.

When the memory cell 205 to be read exhibits an erased VT (e.g., VTarget>VT of the memory cell 205), the memory cell 205 may turn "ON" in response to the application of VTarget to the word line 265 of the selected page 215, which may allow a current to flow in the channel of the string 220, and thus from the bit line 250 to the source line 260. When the memory cell 205 to be read exhibits a programmed VT (e.g., VTarget<VT of the selected memory cell), the memory cell 205 may remain "OFF" despite the application of VTarget to the word line 265 of the selected page 215, and thus may prevent a current from flowing in the channel of the string 220, and thus from the bit line 250 to the source line 260.

A signal on the bit line 250 for the memory cell 205 (e.g., an amount of current below or above a threshold) may be sensed (e.g., by a sense component 170 as described with reference to FIG. 1), and may indicate whether the memory cell 205 became conductive or remained non-conductive in response to the application of VTarget to the word line 265 of the selected page 215. The sensed signal thus may be indicative of whether the memory cell 205 was in an erased state (e.g., storing a logic 1) or a programmed state (e.g., storing a logic 0). Though aspects of the example read operation above have been explained in the context of an SLC memory cell 205 for clarity, such techniques may be extended or altered and applied in the context of a multiple-level memory cell 205 (e.g., through the use of multiple values of VTarget corresponding to the different amounts of charge that may be stored in one multiple-level memory cell 205).

In some cases, as part of a program operation for a memory cell 205, charge may be added to a portion of the memory cell 205 such that current flow through the memory cell 205, and thus the corresponding string 220, may be inhibited when the memory cell 205 is later read. For example, charge may be injected into a charge trapping structure 120 as shown in memory cell 105-a of FIG. 1. In some cases, respective voltages may be applied to the word line 265 of the page 215 and the bulk of the memory cell 205 to be programmed such that a control gate 115 of the memory cell 205 is at a higher voltage than the bulk of the memory cell 205 (e.g., a positive voltage may be applied to the word line). Concurrently, voltages may be applied to the select line 235 and the select line 245 that are above the threshold voltages of the transistor 230 and the transistor 240, respectively, thereby activating the transistor 230 and the transistor 240, and the bit line 250 for the memory cell 205 to be programmed may be set to a relatively high voltage. This may cause an electric field such that electrons are pulled from the source of the memory cell 205 towards the drain. The electric field may also cause some of these electrons to be pulled through dielectric material 125 and thereby injected into the charge trapping structure 120 of the memory cell 205, through a process which may in some cases be referred to as tunnel injection.

In some cases, a single program operation may program some or all memory cells 205 in a page 215, as the memory cells 205 of the page 215 may all share a common word line 265 and a common bulk. For a memory cell 205 of the page 215 for which it is not desired to write a logic 0 (e.g., not desired to program the memory cell 205), the corresponding bit line 250 may be set to a relatively low voltage (e.g., ground), which may inhibit the injection of electrons into a charge trapping structure 120. Though aspects of the example program operation above have been explained in the context of an SLC memory cell 205 for clarity, such techniques may be extended and applied to the context of a multiple-level memory cell 205 (e.g., through the use of multiple programming voltages applied to the word line 265, or multiple passes or pulses of a programming voltage applied to the word line 265, corresponding to the different amounts of charge that may be stored in one multiple-level memory cell 205).

In some cases, as part of an erase operation for a memory cell 205, charge may be removed from a portion of the memory cell 205 such that current flow through the memory cell 205, and thus the corresponding string 220, may be uninhibited (e.g., allowed, at least to a greater extent) when the memory cell 205 is later read. For example, charge may be removed from a charge trapping structure 120 as shown in memory cell 105-a of FIG. 1. In some cases, respective voltages may be applied to the word line 265 of the page 215 and the bulk of the memory cell 205 to be erased such that a control gate 115 of the memory cell 205 is at a lower voltage than the bulk of the memory cell 205 (e.g., a positive voltage may be applied to the bulk), which may cause an electric field that pulls electrons out of the charge trapping structure 120 and into the bulk of the memory cell 205. In some cases, a single program operation may erase all memory cells 205 in a block 210, as the memory cells 205 of the block 210 may all share a common bulk.

In some cases, electron injection and removal processes associated with program and erase operations may cause stress on a memory cell 205 (e.g., on the dielectric material 125). Over time, such stress may in some cases cause one or more aspects of the memory cell 205 (e.g., the dielectric material 125) to deteriorate. For example, charge trapping structure 120 may become unable to maintain a stored charge. Such deterioration may be an example of a wearout mechanism for a memory cell 205, and for this or other reasons, some memory cells 205 may support a finite quantity of program and erase cycles.

In accordance with examples as disclosed herein, a memory device that includes the memory architecture 200 may include one or more barrier regions to prevent etching to and exposure of control circuitry during manufacturing the memory device. For example, the memory device may include control circuitry that is operable to control various access components of the memory architecture 200 (e.g., word lines 265, bit lines 250, select lines 235, select lines 245, source lines 260) to access the memory cells 205. The memory device may also include contact regions over the control circuitry and which may be configured to couple one or more of the access components to one or more components of the control circuitry. The memory device may include a barrier region between respective contact regions that includes a barrier material. The barrier material may act as a removal stop (e.g., an etching stop) to prevent removing (e.g., etching) from contacting or exposing control circuitry over which the barrier region and the contact regions are located. Including the barrier material in the barrier region may prevent removing between the contact regions that may result from misalignment or precision tolerance errors during manufacturing operations, thereby protecting the control circuitry, preventing shorting, and ensuring normal operation of the memory device, among other benefits.

Figure 3:
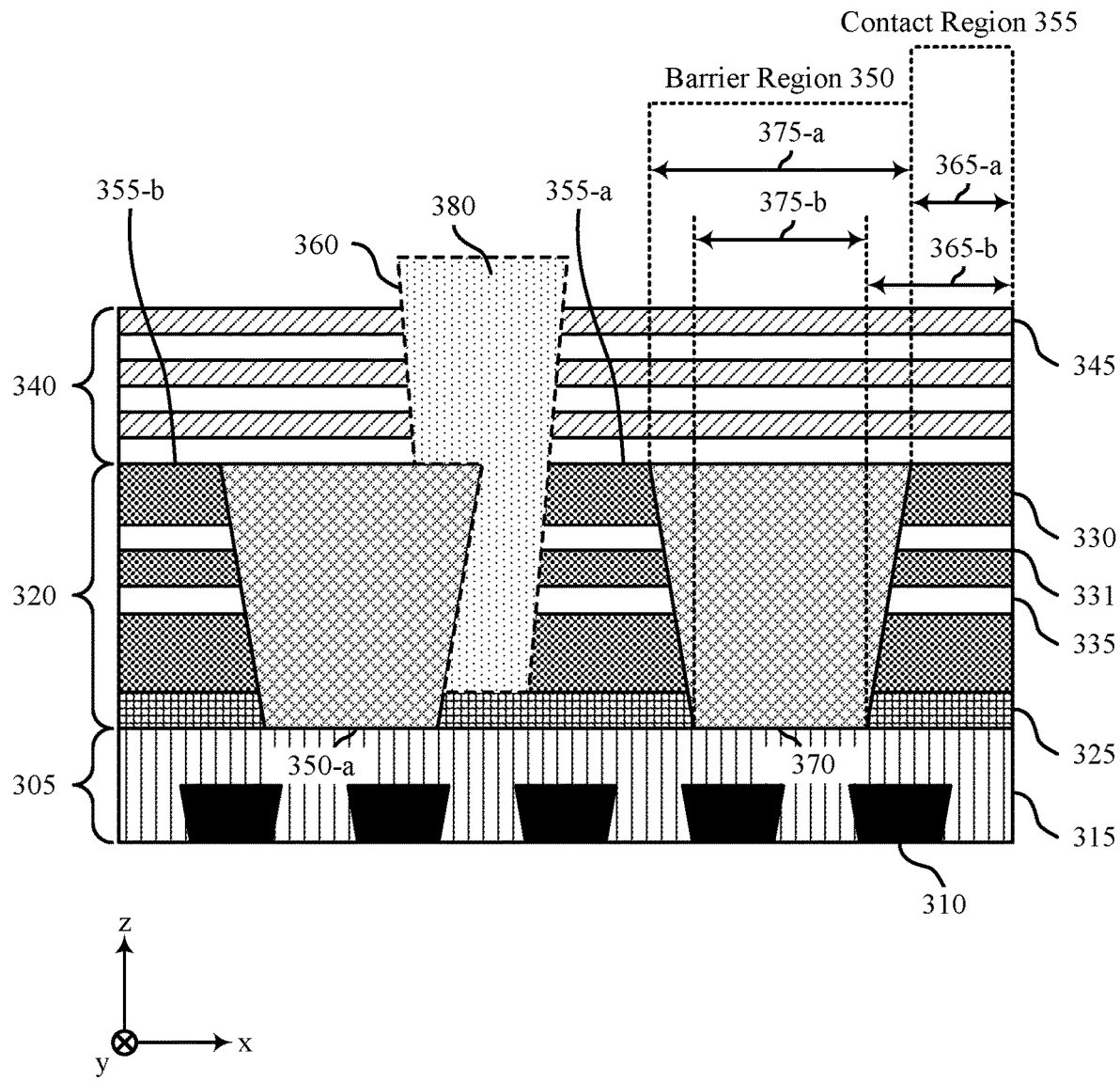
FIG. 3 illustrates an example of a memory architecture that supports a barrier structure for preventing removal of, such as etching to, control circuitry in accordance with examples as disclosed herein.

FIG. 3 illustrates a cross-sectional view of an example of a memory architecture 300 that supports a barrier structure for preventing removal of, such as etching to, control circuitry in accordance with examples as disclosed herein. The memory architecture 300 may be an example for implementing aspects of a memory device 100 or a memory architecture 200 described with reference to FIGS. 1 and 2, respectively. For example, the memory architecture 300 may be an example of a portion of a memory device 100 or a memory device that implements the memory architecture 200. For illustrative purposes, aspects of the memory architecture 300 may be described with reference to an x-direction, a y-direction, and a z-direction of the illustrated coordinate system. In some examples, the z-direction may be illustrative of a direction (e.g., a vertical direction, a level direction) orthogonal to a surface of a substrate (e.g., a surface in an xy-plane, a surface upon or over which other materials may be deposited), and each of the related regions, illustrated by their respective cross-section in an xz-plane, may extend for some distance along the y-direction.

The memory architecture 300 may include a circuitry stack 305, in which control circuitry 310 may be formed over the substrate, based on doping portions of the substrate, or a combination thereof. The control circuitry 310 may be associated with accessing or operating memory arrays of a memory device that implements that memory architecture 300. and may be arranged as CMOS circuitry (e.g., CMOS under array (CuA) circuitry). In some examples, control circuitry may be formed from one or more metal materials, such as tungsten. The memory architecture 300 may include a first material 315 in the circuitry stack 305 over (e.g., and surrounding) the control circuitry 310, where the first material 315 may be a nitride material such as carbon doped nitride. The first material 315 may form an xy-plane over which other materials may be orthogonally deposited (e.g., along the z-direction).

The memory architecture 300 may include a source stack 320 formed over (e.g., above) the circuitry stack 305. The source stack 320 may include a metal material 325 for coupling (e.g., configured to couple) components of the memory device with the control circuitry 310 via contact regions 355. The metal material 325 may be formed in an xy-plane onto the first material 315 (e.g., extending up along z-direction), creating the basis for the contact regions 355. In some examples, the metal material 325 may be a tungsten material, such as tungsten silicide (e.g., which may be referred to as a WSIX). The contact regions 355, illustrative by the boundary in FIG. 3, may include a stack of one or more materials for coupling the components of the memory device with the control circuitry 310. For example, the contact regions 355 may couple one or more components of included or formed within a memory array stack 340 to the control circuitry 310. Additional materials included in the contact regions 355 may be formed in an xy-plane onto the metal material 325 (e.g., extending along the z-direction). In some implementations, such as illustrative in FIG. 3, the contact regions 355 may be tapered such that a top width 365-a (e.g., a length of the contact regions 355 along the x-direction and at a top surface of the contact regions 355 along the z-direction) and a bottom width 365-b (e.g., a length of the contact regions 355 along the x-direction and at a bottom surface of the contact regions 355 along the z-direction) may be different. For example, in the example of FIG. 3, the top width 365-a may be less than the bottom width 365-b (e.g., although the top width 365-a may be greater than the bottom width 365-b). In some other implementations, the contact regions 355 may not be tapered and the top width 365-a and the bottom width 365-b may instead be the same (or approximately the same). In some cases, the contact regions 355 may include a polymer material 330, such as a polysilicon material. In some other cases, the contact regions 355 may include alternating layers of the polymer material 330 and an oxide material 335. In the example of FIG. 3, the contact regions may include three layers of the polymer material 330 that alternate with two layers of the oxide material 335, however, the contact regions 355 may include any quantity of alternating polymer materials 330 and oxide materials 335.

The memory architecture 300 may include the memory array stack 340 formed above the source stack 320. The memory array stack 340 may include alternating layers of a nitride material 345 and the oxide material 335, which may form the basis of a memory array of the memory device. The layers of the nitride material 345 and the oxide material 335 may be connected in xy-planes (e.g., extending along the z-direction) and coupled with other components of the memory device. The memory array stack 340 may be subject to manufacturing operations (e.g., removing operations such as etching, recess operations, deposition operations, and the like) to form access lines, memory cells, or decoding circuitry, among other components of the memory device, in the memory array stack 340.

The memory architecture 300 may also include one or more barrier regions 350 in the source stack 320. Each barrier region 350 may be located between (e.g., along the x-direction) two respective contact regions 355 in the source stack 320. The barrier regions 350 may also be located between (e.g., along the z-direction) the first material 315 in the circuitry stack 305 and the memory array stack 340. For example, a barrier region 350-*a* may be positioned between a contact region 355-*a* and a contact region 355-*b* and between the first material 315 and the memory array stack 340. In some examples, the barrier region 350-*a* may include a barrier material 370 filling the entirety of the barrier region 350-*a*. That is, the barrier material 370 may fill an entirety of the space between the contact region 355-*a*, the contact region 355-*b*, the first material 315, and the memory array stack 340. For example, the barrier material 370 may extend from a sidewall of the contact region 355-*a* to a sidewall of the contact region 355-*b*. The barrier material 370 may also extend from a top surface of the first material 315 to a bottom surface of a bottom layer of the memory array stack 340 (e.g., a bottom layer of the oxide material 335 in the memory array stack 340).

In some examples, the barrier material 370 may be in contact (e.g., direct contact) with the one or more materials of the contact regions 355, the first material 315, or the memory array stack 340. For example, the barrier material 370 may be in contact with the metal material 325 of one or more of the contact region 355-*a* and the contact region 355-*b*. Additionally or alternatively, the barrier material 370 may be in contact with one or more of the polymer material 330 and the oxide material 335 included in one or more of the contact region 355-*a* and the contact region 355-*b*. Additionally or alternatively, the barrier material 370 may be in contact with the first material 315, the bottom layer of the memory array stack 340, or both. In some examples, one or more intermediate materials (e.g., layers) (not shown) may be located (e.g., formed) between the barrier material 370 and one or more materials, such as one or more materials in the contact regions 355, the first material 315, or the bottom layer of the memory array stack 340 such that the barrier material is not in contact with one or more of the contact regions 355, the first material 315, or the bottom layer of the memory array stack 340.

In some implementations, such as illustrative in FIG. 3, the barrier regions 350 may be tapered such that a top width 375-*a* (e.g., a length of the barrier regions 350 along the x-direction and at a top surface of the barrier regions 350 along the z-direction) and a bottom width 375-*b* (e.g., a length of the barrier regions 350 along the x-direction and at a bottom surface of the barrier regions 350 along the z-direction) may be different. For example, in the example of FIG. 3, the top width 375-*a* may be greater than the bottom width 375-*b* at the bottom of the barrier regions 350 (e.g., although the top width 375-*a* may be less than the bottom width 375-*b*, for example, if the top width 365-*a* is greater than the bottom width 365-*b*). In some other implementations, the barrier regions 350 may not be tapered and the top width 365-*a* and the bottom width 365-*b* may instead be the same.

In some manufacturing operations, portions of the contact regions 355 of the source stack 320, portions of the memory array stack 340, or both, may be removed by an etching operation. In some examples, the etching operation may be an example of a dry etch (e.g., used for directional material removal), for example, using hot phosphoric acid, among other substances that may be used to perform a dry etch. The etching operation may form a cavity 360 through (e.g., along the z-direction) the memory arrack stack 340 and at least a portion of a contact region 355. For example, the contact region 355-*a* may be a target of the etching operation such that the cavity 360 may be formed through the memory array stack 340 and at least part of (e.g., one or more materials within) the contact region 355-*a*.

In some cases, the cavity 360 may be used for coupling the control circuitry 310 to other components of the memory device. For example, a material 380 may be formed (e.g., deposited) in the cavity 360 that is used to form interconnect circuitry, such as a TAV, for coupling the control circuitry 310 to access circuitry. For instance, the material 380 may be a conductive material used to form a conductive pillar in the cavity 360 that couples with the metal material 325 of the contact region 355-*a*, which may be a metal contact of the contact region 355-*a*. The conductive pillar may couple with access circuitry located in the memory array stack 340 or over the memory array stack 340 (not shown) such that the control circuitry may be coupled with the access circuitry using the conductive pillar. In some other cases, the cavity 360 may be used to support additional removing (e.g., etching) and/or deposition operations (e.g., for forming memory cells, access circuitry, or decoding circuitry, among other components of the memory device) occurring at the memory array stack 340, as described with reference to FIG. 5D below. Here, the material 380 deposited in the cavity 360 may be a dielectric material.

In some examples, the cavity 360 and the material 380 may extend into the contact regions 355 based on the material 380 deposited in the cavity 360, the materials included in the contact regions 355, or a combination thereof. For example, if the contact regions 355 include the oxide material 335, the cavity 360 and the material 380 may extend to a top surface 331 of the middle layer of the polymer material 330 in the contact regions 355 of the source stack 320. That is, the top layer of the polymer material 330 and the oxide material 335 along the z-direction may be removed (e.g., etched) such that the material 380 extends to the top surface 331. If the contact regions 355 exclude the oxide material 335, the cavity 360 and the material 380 may extend to the metal material 325. In some examples, if the material 380 is the conductive material, the cavity 360 and the material 380 may extend to the metal material 325, for example, regardless of whether the contact regions 355 include the oxide material 335.

The barrier region 350-*a* may resist the removing (e.g., etching) operation due to the barrier material 370 deposited into the barrier region 350-*a*. That is, the barrier material 370 may be a material that is resistant to the removing operation (e.g., resistant to etching operations using hot phosphoric acid) such that the cavity 360 may be prevented from extending into the barrier region 350-*a*. In some examples, the barrier material 370 may be a non-conductive material or a metal oxide (e.g., a transition metal oxide), such as hafnium oxide, carbon doped silicon nitride, hafnium silicate, magnesium oxide, or aluminum oxide among other oxide, nitride, or silicon containing materials that are resistant to the removing operation.

Resisting the removing (e.g., etching) operation may protect the control circuitry 310 from damage and exposure, among other benefits. For example, in some cases, misalignments and/or precision tolerances associated with the removing operation may cause the removal to form (e.g., by etching) the cavity 360 to overlap at least partially with the barrier region 350-a in the x-direction rather than solely with the contact region 355-a. However, the barrier material 370 may prevent the removing operation from removing the cavity 360 into the barrier region 350-a. Thus, the cavity 360 may be removed in the contact region 355-a neighboring the barrier region 350-a. In cases where a dielectric material (e.g., an oxide such as silicon oxide) is used in the barrier region 350 instead of the barrier material 370, the removing operation may unintentionally remove the cavity 360 down (e.g., along the z-direction) to the control circuitry 310 (e.g., or to the first material 315), thereby exposing the control circuitry 310 to subsequent removing and deposition operations, which may damage the control circuitry 310 or cause unintentional shorting to the control circuitry 310. However, with the barrier material 370 included in the barrier region 350-a, the barrier material 370 may prevent the removing from extending to the control circuitry 310.

In some examples, the material 380 may be in contact with the barrier material 370 based on preventing the removal (e.g., etch). For example, because the etch at least partially overlaps with the barrier region 350-a in the x-direction and the barrier material 370 is unetched during the formation of the cavity 360, the etch may expose the barrier material 370. As a result, the material 380 (e.g., the conductive pillar, the dielectric material) subsequently deposited in the cavity 360 may be in contact with the barrier material 370. In some examples, one or more intermediate materials (e.g., layers) may separate the material 380 and the barrier material 370.

Figure 4:
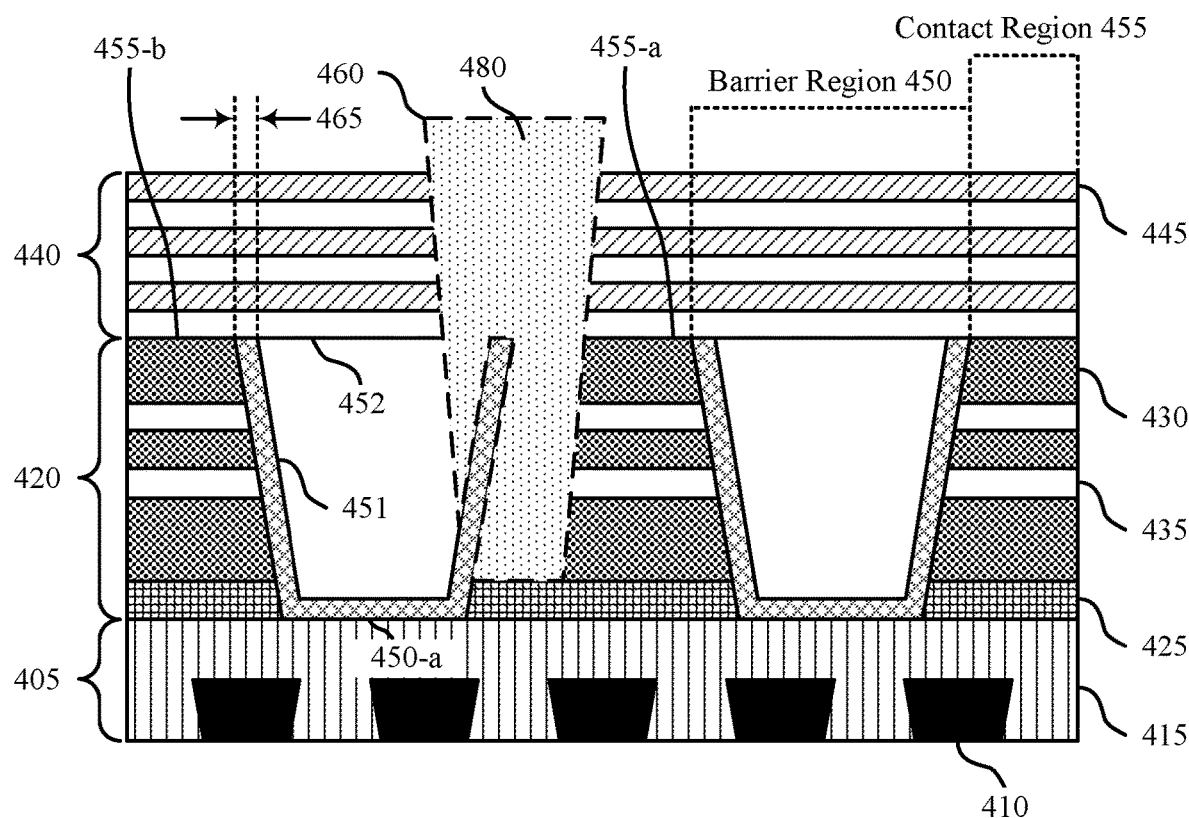
FIG. 4 illustrates an example of a memory architecture that supports a barrier structure for preventing removal of, such as etching to, control circuitry in accordance with examples as disclosed herein.

FIG. 4 illustrates a cross-sectional view of an example of a memory architecture 400 that supports a barrier structure for preventing removal of, such as etching to, control circuitry in accordance with examples as disclosed herein. The memory architecture 400 may be an example for implementing aspects of a memory device or a memory architecture 200 described with reference to FIGS. 1 and 2, respectively. For example, the memory architecture 400 may be an example of a portion of a memory device 100 or a memory device that implements the memory architecture 200. For illustrative purposes, aspects of the memory architecture 400 may be described with reference to an x-direction, a y-direction, and a z-direction of the illustrated coordinate system. In some examples, the z-direction may be illustrative of a direction (e.g., a vertical direction, a level direction) orthogonal to a surface of a substrate (e.g., a surface in an xy-plane, a surface upon or over which other materials may be deposited), and each of the related regions, illustrated by their respective cross-section in an xz-plane, may extend for some distance along the y-direction.

The memory architecture 400 may include a circuitry stack 405, which may be an example of a circuitry stack 305 described with reference to FIG. 3. For example, the circuitry stack 405 may include control circuitry 410 and a first material 415, which may be examples of control circuitry 310 and a first material 315 described with reference to FIG. 3, formed over the substrate.

The memory architecture 400 may also include a source stack 420 and a memory array stack 440 formed over the circuitry stack 405, which may be examples of a source stack 320 and a memory array stack 340 described with reference to FIG. 3, respectively. For example, the source stack 420 may include contact regions 455, which may be examples of contact regions 355 described with reference to FIG. 3. For instance, the contact regions 455 may include a metal material 425 (e.g., a metal material 325) that may form respective metal contacts of respective contact regions 455. The contact regions 455 may also include one or more layers of a polymer material 430 (e.g., a polymer material 330) that may alternate along the z-direction with layers of an oxide material 435. The memory array stack 440 may be formed over the source stack 420 and may include alternating layers of a nitride material 445 (e.g., a nitride material 345) and the oxide material 435. The memory array stack 440 may form the basis of a memory array of a memory device that implements that memory architecture 400 and may be subject to manufacturing operations to form access lines, memory cells, or decoding circuitry, among other components of the memory device, in the memory array stack 440.

The memory architecture 400 may also include barrier regions 450 in the source stack 420. Each barrier region 450 may be located between (e.g., along the x-direction) two respective contact regions 455 in the source stack 420. The barrier regions 450 may also be located between (e.g., along the z-direction) the first material 415 and the memory array stack 440. For example, a barrier region 450-a may be positioned between a contact region 455-a and a contact region 455-b and between the first material 415 and the memory array stack 440.

The barrier region 450-a may include a barrier material 451 (e.g., a barrier material 370) forming a portion (e.g., a layer, a liner) around the barrier region 450-a and a dielectric material 452 inside a remaining space of the barrier region 450-a. That is, the barrier region 450-a may include the barrier material 451 and the dielectric material 452, and the barrier material 451 may form a portion (e.g., a layer, a liner) between various materials (e.g., between two or more materials) such as the dielectric material 452 and the respective contact regions 455 (e.g., and the first material 415). For example, the barrier material 451 may be positioned between the dielectric material 452 and the first material 415 and between the dielectric material 452 and one or more materials of the contact regions 455-a and 455-b, such as the metal material 425, the polymer material 430, the oxide material 435, or a combination thereof. In some examples, the barrier material 451 may be positioned between the dielectric material 452 and one or more intermediate materials next to the first material 415 and between the dielectric material 452 and one or more intermediate materials next to one or more materials of the contact regions 455-a and 455-b, such as the metal material 425, the polymer material 430, the oxide material 435, or a combination thereof.

In some examples, a first surface (e.g., outer surface) of the liner may be in contact with one or more materials of the contact regions 455-a and 455-b, the first material 415, the memory array stack 440, or a combination thereof. For example, the barrier material 451 may be in contact with the metal material 425 of one or more of the contact regions 455. Additionally or alternatively, the barrier material 370 may be in contact with one or more of the polymer material 430 and the oxide material 435 included in one or more of the contact regions 455. Additionally or alternatively, the barrier material 451 may be in contact with the first material 415, a bottom layer of the memory array stack 440, or both. In some examples, one or more intermediate materials (e.g., layers) (not shown) may be located (e.g., formed) between the barrier material 451 and the contact regions 455, the first material 415, or the bottom layer of the memory array stack 440 such that the barrier material is not in contact with the respective materials (and instead may be in contact with the one or more intermediate materials).

In some examples, a second surface (e.g., inner surface) of the liner may be in contact with the dielectric material 452 filling the space within the barrier region 450-*a* not occupied by the liner. In some cases, one or more intermediate materials (e.g., layers) (not shown) may be located between the second surface of the liner and the dielectric material 452. In some examples, the dielectric material 452 may be in contact with the bottom layer of the memory array stack 440.

A thickness 465 of the barrier material 451 may be based on various factors, such as a distance between respective contact regions 455 or a dielectric constant of the barrier material 451 (e.g., a kappa value (K-value) of the barrier material 451). The volume of the dielectric material 452 in the barrier region 450-*a* may be inversely proportional to the thickness 465 of the barrier material 451. That is, as the thickness 465 of the barrier material 451 increases, the volume of the dielectric material 452 may decrease. Additional details related to the thickness 465 and of the barrier material 451 are described with reference to FIG. 5B below.

The barrier regions 450 may protect the control circuitry 410 from being damaged or exposed by removal operations that target a specific contact region 455, but at least partially overlap with a barrier region 450 in the x-direction, for example, due to misalignments or precision tolerances associated with the removal operations. For example, an etching operation may form a cavity 460 through (e.g., along the z-direction) the memory arrack stack 440 and at least a portion of a contact region 455. For example, the contact region 455-*a* may be a target of the etching operation such that the cavity 460 may be formed through the memory array stack 440 and at least part of (e.g., one or more materials within) the contact region 455-*a*. The cavity 460 may be an example of a cavity 360 described with reference to FIG. 3. For example, the cavity 460 may be used to form interconnect circuitry for coupling with the control circuitry 410 or may be used to support additional removing and/or deposition operations for forming components of the memory device in the memory array stack 440, as described with reference to FIG. 5D below. Additionally, the cavity 460 may extend to the metal material 425 of the contact region 455-*a* or to another layer of the contact region 455-*a* (e.g., a top surface of a middle layer of the polymer material 330).

The barrier region 450-*a* may resist the removing (e.g., etching) operation due to the barrier material 451 deposited into the barrier region 450-*a*. That is, the barrier material 451 may be a material (e.g., a barrier material 370) that is resistant to the removing such that the cavity 460 may be prevented from extending through the barrier region 450-*a* and to the first material 415. For example, the dielectric material 452 may be a material that is removed in response to the removing (e.g., etching) operation. As a result, the dielectric material 452 may be removed (e.g., etched) such that the cavity 460 may extend into the barrier region 450-*a*. However, because the barrier material 451 is positioned between the dielectric material 452 and the first material 415 (e.g., as the liner), the barrier material 451 may stop the removal from extending to the first material 415, thereby protecting the control circuitry 410.

A material 480 may be deposited in the cavity 460, which may be an example of a material 380 described with reference to FIG. 3. For example, the material 480 may be a conductive material that forms a conductive pillar in the cavity 460. Alternatively, the material 480 may be a dielectric material. The material 380 may be in contact with one or more surfaces of the barrier material 451. For example, the material 380 may be in contact with a portion of the outer surface of the barrier material 451 based on the cavity 460 extending into the contact region 455-*a*. The material 480 may also be in contact with a portion of the inner surface of the barrier material 451 based on the cavity 460 extending into the dielectric material 452 (e.g., a portion of the dielectric material 452 being removed). In some examples, one or more intermediate materials (e.g., layers) may separate the material 480 and the barrier material 451.

FIGS. 5A through 5D illustrate examples of processing steps 500 of a method for forming a barrier structure for preventing removal of, such as etching to, control circuitry in accordance with examples as disclosed herein. The processing steps 500 may illustrate aspects of a sequence of manufacturing operations for fabricating aspects of a memory device implementing a memory architecture 400 described with reference to FIG. 4. It is noted, however, that the processing steps 500 may be adapted and applied for fabricating aspects of a memory device implementing a memory architecture 300 described with reference to FIG. 3. The processing steps 500 illustrate various cross-sectional views of the memory device. For illustrative purposes, aspects of the memory device may be described with reference to an x-direction, a y-direction, and a z-direction of the illustrated coordinate system. For example, the processing steps 500 illustrate cross-sectional views of the memory device in an xz-plane through the memory device. Although the processing steps 500 illustrate examples of certain relative dimensions and quantities of various features, aspects of the memory device may be implemented with other relative dimensions or quantities of such features in accordance with examples as disclosed herein.

Figure 5A:
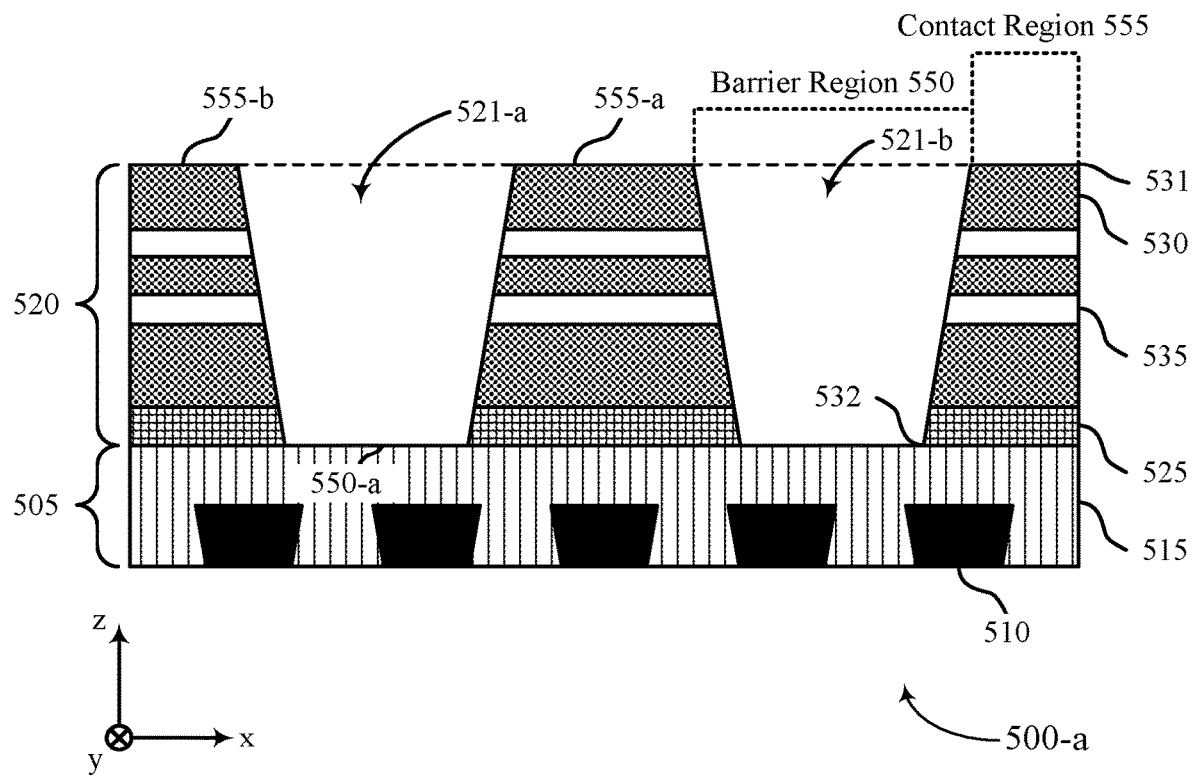
FIGS. 5A, 5B, 5C, and 5D illustrate examples of processing steps of a method for forming a barrier structure for preventing removal of, such as etching to, control circuitry in accordance with examples as disclosed herein.

Operations illustrated in and described with reference to FIGS. 5A through 5D may be performed by a manufacturing system, such as a semiconductor fabrication system configured to perform additive operations such as deposition or bonding, subtractive operations such as removing, etching, trenching, planarizing, or polishing, and supporting operations such as masking, patterning, photolithography, or aligning, among other operations that support the described techniques. In some examples, operations performed by such a manufacturing system may be supported by a process controller or its components as described herein FIG. 5A illustrates a portion of the memory device after a processing step 500-*a*. In the processing step 500-*a*, a substrate stack 505 may be formed on the substrate. Forming the substrate stack 505 may include forming control circuitry 510 and forming a first material 515 over (e.g., and surrounding) the control circuitry 510 (e.g., along the z-direction), which may be examples of control circuitry 310 and 410 and a first material 315 and 415 described with reference to FIGS. 3 and 4. The control circuitry 510 and the first material 515 may be formed over a substrate, which may be a semiconductor or other substrate.

In the processing step 500-*a*, a source stack 520 may be formed over (e.g., on) the substrate stack 505. The source stack 520 may include a metal layer 525 and one or more layers 530 of a polymer material, such as a polymer material 330 and 430 described with reference to FIGS. 3 and 4, where forming the source stack 520 may include forming (e.g., depositing) the metal layer 525 over (e.g., along the z-direction) the first material 515 and forming the one or more layers 530 over the metal layer 525. In some examples, the processing step 500-*a* may include forming (e.g., depositing) alternating layers 530 and layers 535 of an oxide material, such as an oxide material 435 and 435 described with reference to FIGS. 3 and 4. In the example of FIG. 5A, the processing step 500-*a* may include depositing three layers 530 that alternate with two layers 535, however any quantity of alternating layers 530 and 535 may be deposited. In some examples, however, the processing step 500-*a* may include depositing a single layer 530 without deposition of any layers 535.

In some cases, the first material 515, the metal layer 525, the layers 530, and the layers 535 may be formed such that each material may be deposited coplanar on the substrate (e.g., as an xy-plane extending up along the z-direction). In some cases, the first material 515, the metal layer 525, the layers 530, the layers 535, or a combination thereof, may be planarized (e.g., polished) prior to depositing the following material (e.g., using a chemical mechanical planarization (CMP) process). In some examples, the materials in the source stack 520 may be deposited using a diffusion procedure. In some examples, the materials in the source stack 520 may be deposited using chemical vapor deposition (CVD) or plasma enhanced chemical vapor deposition (PECVD), among other deposition processes.

In the processing step 500-*a*, the source stack 520 may be removed (e.g., etched) to form cavities 521. Removing (e.g., by etching) the source stack 520 may include removing the cavities 521 through the metal layer 525, the layers 530, and the layers 535 (e.g., along the z-direction) to the first material 515. Removing (e.g., by etching) the metal layer 525, the layers 530, and the layers 535 may form a quantity of barrier regions 550 and contact regions 555, where an example barrier region 550-*a* is formed by removing a cavity 521-*a*. Respective unremoved portions of the metal layer 525, the layers 530, and the layers 535 may form respective contact regions 555. For example, removing the cavity 521-*a* and a cavity 521-*b* may form a contact region 555-*a*, which may include a first portion of the metal layer 525, the layers 530, and the layers 535. Removing the cavity 521-*a* and another cavity 521 (not shown) may form a contact region 555-*b*, which may include a second portion of the metal layer 525, the layers 530, and the layers 535. Additional barrier regions 550 and contact regions 555 may similarly be formed. In some implementations, removing the cavities 521 may remove the contact regions 555 such that the contact regions 555 are tapered. For example, a top width of the contact regions 555 may be less than a bottom width 532 the contact regions 555 as described with reference to FIG. 3. In some other implementations, the contact regions 555 may be removed such that the contact regions 555 may not be tapered and have same top and bottom widths.

Figure 5B:
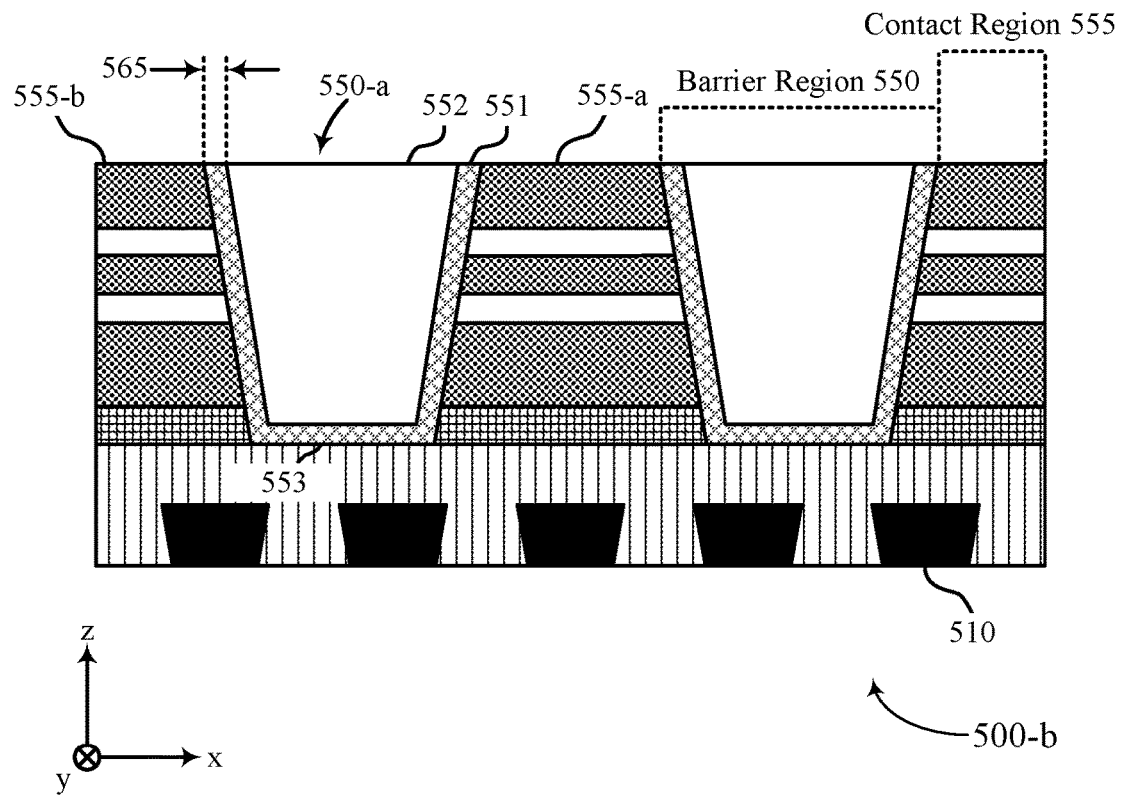

FIG. 5B illustrates a portion of the memory device after a processing step 500-*b*. In the processing step 500-*b*, a barrier material 553 may be deposited into the cavities 521, where the barrier material 553 may be associated with preventing a removal (e.g., an etch) from extending to the control circuitry 510. For example, the barrier material 553 may be an example of a barrier material 370 and 451 described with reference to FIGS. 3 and 4. In some cases, the barrier material 553 may be deposited such that the barrier material may fill the entirety of the cavities 521. In some other cases, such as in the example of FIG. 5B, the barrier material 553 may be deposited such that the barrier material 553 forms a liner 551 over (e.g., along the z-direction) the first material 515 and between (e.g., along the x-direction) respective contact regions 555. For example, the liner 551 of the barrier region 550-*a* may line a first sidewall of the contact region 555-*a*, a first sidewall of the contact region 555-*b*, and a top surface of the first material 515 over which the barrier region 550-*a* is located. The processing step 500-*b* may include depositing a dielectric material 552 may be deposited into the cavities 521 over the liner 551 to fill the cavities 521.

In some examples, the barrier material 553 may be in contact with respective contact regions 555 and in contact with the first material 515 (e.g., the top surface of the first material 515 along the z-direction). For example, the barrier material 553 of the barrier region 550-*a* may be in contact with the layers of the contact regions 555-*a* and 55-*b* and with the top surface of the first material 515. The barrier material 553 may also be in contact with the dielectric material 552. In some examples, one or more intermediate materials (e.g., layers) may be deposited between the liner 551 and the respective materials such that barrier material 553 is not in direct contact with the materials.

In some examples, a thickness 565 of the barrier material 553 for forming the liner 551 may be determined based on a distance (e.g., along the x-direction) between respective contact regions 555, a K-value of the barrier material 553, a K-value of the oxide material of the layers 535, or a combination thereof. For example, if the barrier material 553 is deposited to fill an entirety of a barrier region 550, the cavities 521 may be removed (e.g., by etching) such that a distance between neighboring contact regions 555 in the x-direction is increased relative to if the barrier material 553 is deposited to form the liner 551. For instance, the barrier material 553 may have breakdown voltage such that current may laterally flow between contact regions 555 if the barrier material 553 is exposed to the breakdown voltage, and the increased distance may mitigate the effects of such breakdown. To increase the distance between contact regions 555, in some cases, the cavities 521 may be removed to increase a width of the barrier regions 550 in the x-direction, which may decrease a width of the contact regions 555 in the x-direction. As a result, a contact area of the contact regions 555 (e.g., in an xy plane) may decrease, which may cause a greater propensity for misalignment and precision tolerance errors during manufacturing.

Depositing the barrier material 553 as the liner 551 may enable a reduction in the distances between contact regions 555, an increase in the contact areas of the contact regions 555, or both. For example, the deposition of the dielectric material 552 in the barrier regions 550 may mitigate current flow caused by exposure of the barrier material 553 to the breakdown voltage, thereby enabling distance reduction. In some examples, the thickness 565 of the liner 551 may be dynamically determined based on the distance between respective contact regions 555. For example, after removing the cavities 521, a manufacturing system may determine a resulting distance between the contact region 555-*a* and the contact region 555-*b* (e.g., a minimum resulting distance between two contact regions 555 of the contact regions 555 formed). As the distance increases, the thickness 565 may increase, and vice versa. Additionally or alternatively, the thickness 565 may be determined based on respective K-values of the barrier material 553 and the oxide material. For example, as a difference between the K-values increases, the thickness 565 may decrease, and vice versa. In some examples, the thickness 565 of the barrier material 553 may be a statically configured value.

In some examples, the processing step 500-*b* may include planarizing the source stack 520. For example, the processing step 500-*b* may include planarizing the barrier material 553, the dielectric material 552, and a top layer of the contact regions 555 after deposition of the barrier material 553 and the dielectric material 552.

Figure 5C:
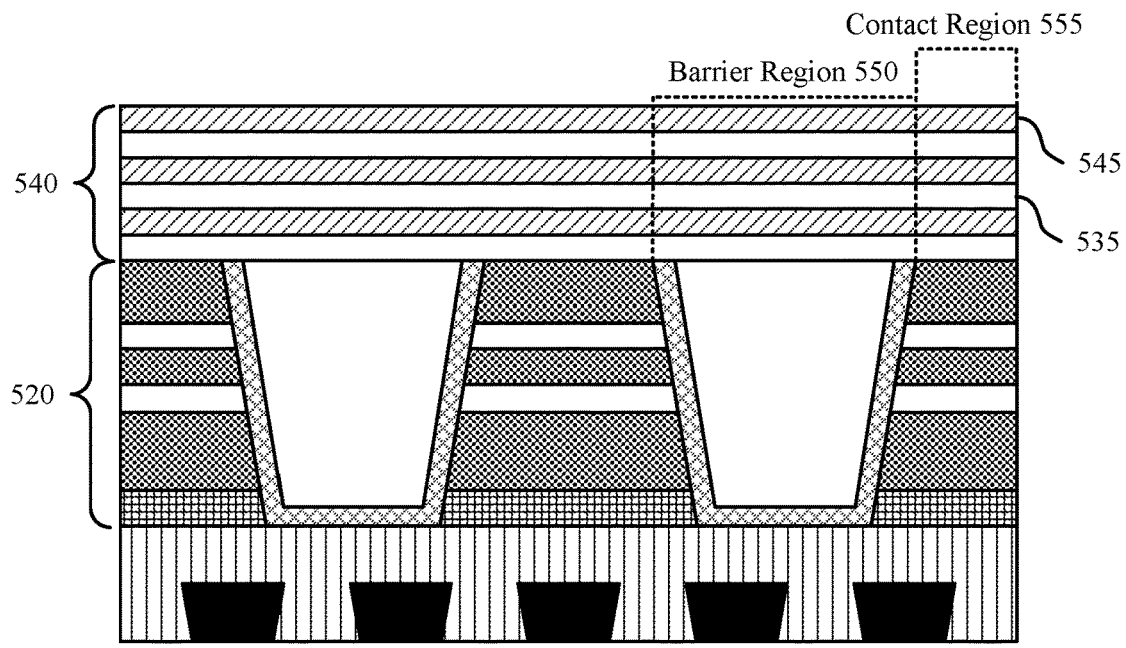

FIG. 5C illustrates a portion of the memory device after a processing step 500-c. In the processing step 500-c, a memory array stack 540 may be formed over the source stack 520, thereby contacting the barrier regions 550 and the contact regions 555. The memory array stack 540 may include alternating layers 545 of a nitride material and layers 535 of the oxide material. The nitride material may be an example of a nitride material 345 and 445 described with reference to FIGS. 3 and 4. Any quantity of layers may be deposited, for example, based on a desired quantity of levels (e.g., decks) of the memory device.

In some cases, the layers 545 and the layers 535 may be formed such that each material may be deposited coplanar on the surfaces of the source stack 520 (e.g., as an xy-plane extending along the z-direction). In some examples, a first layer 535 may be deposited directly onto the surfaces of the materials of the source stack 520. In some examples, the materials in the memory array stack 540 may be deposited using a diffusion procedure, such as a CVD or PECVD procedure, among other deposition processes.

Figure 5D:
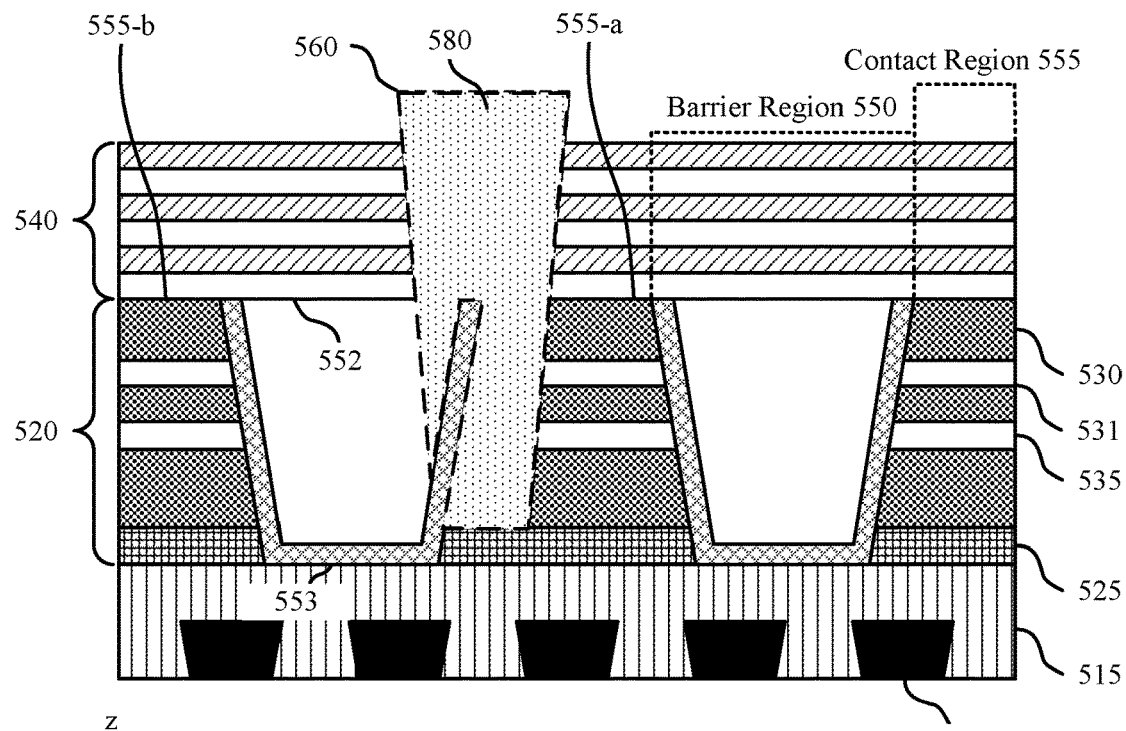

FIG. 5D illustrates a portion of the memory device after a processing step 500-d. In the processing step 500-d, one or more cavities 560 may be formed by removing (e.g., etching) through (e.g., along the z-direction) the memory array stack 540 and at least partially into target contact regions 555. For example, the processing step 500-d may include removing the cavity 560 through the memory array stack 540 and into one or more layers of the contact region 555-a. The barrier material 553 of the barrier region 550-a may prevent the removal from extending through the barrier region 550-a and prohibit the cavity 560 from contacting or exposing the first material 515 and/or the control circuitry 510. In some cases, the cavity 560 may extend to the metal layer 525 of the contact region 555-a. In some other cases, the cavity 560 may not extend to the metal layer 525 and may instead extend partially into the layers 530 and layers 535 of the contact region 555-a. For example, if the contact region 555-a includes the alternating layers 530 and layers 535, the cavity 560 may extend to the top surface 531 of a second layer 530 of the polymer material (e.g., a top layer 530 and a top layer 535 may be etched). The cavity 560 may also extend at least partially into the barrier region 550-a based on the barrier region 550-a including the dielectric material 552. For example, the removal (e.g., etch) that creates the cavity 560 may at least partially overlap with the dielectric material 552 of barrier region 550-a in the x-direction, which may result in the overlapped portion of the dielectric material 552 being removed. If the barrier material 553 filled the entirety of the barrier region 550-a, the cavity 560 may stop at the barrier region 550-a and not extend into it.

In the processing step 500-d, a material 580 may be deposited into the cavity 560, which may be an example of the material 380 and 480 described with reference to FIGS. 3 and 4. For example, the material 580 may be an example of a conductive pillar or a dielectric material deposited in the cavity 560, as described with reference to FIGS. 3 and 4. In some examples, the cavity 560 may facilitate additional removing (e.g., etching) and/or deposition operations occurring at the memory array stack 540. For example, one or more materials (e.g., layers) of the memory array stack 540 may be removing (e.g., at least partially) using the cavity 560. That is, the cavity 560 may enable removing operations to reach the one or more materials within the memory array stack 540. Additionally or alternatively, one or more materials may be deposited within the memory array stack 540 (e.g., within cavities or voids formed in the memory array stack 540 based on the removing operations). Such removing and deposition operations may support the formation of various components of the memory device, such as the formation of memory cells, access circuitry, and decoding circuitry, among other components. In some examples, if the cavity 560 is used to facilitate the formation of the memory device components (e.g., other than the conductive pillar), the material 580 may be the dielectric material deposited in the cavity 560 after the formation of the memory device components.

Figure 6:
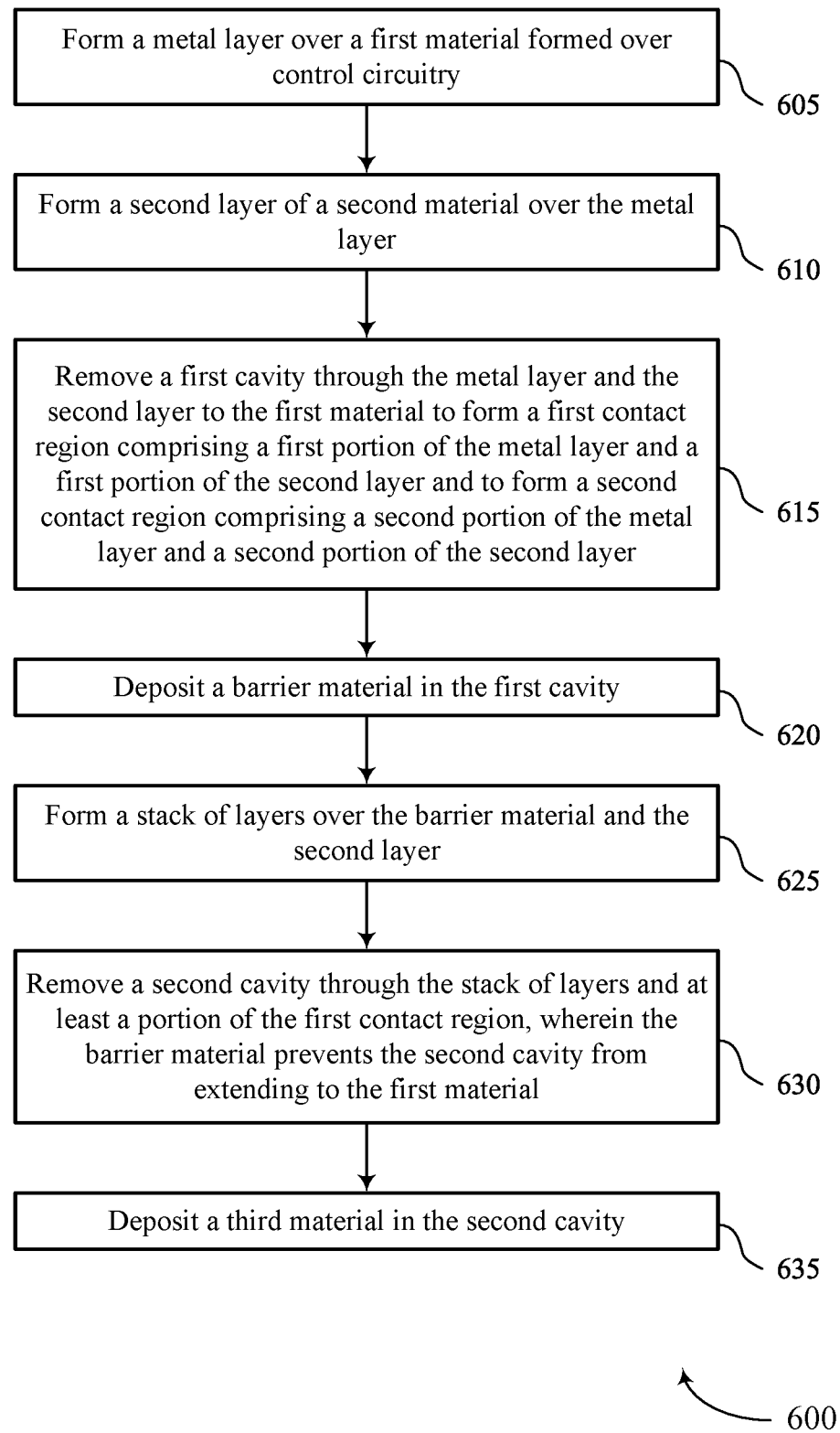
FIG. 6 shows a flowchart illustrating a method or methods that support a barrier structure for preventing removal of, such as etching to, control circuitry in accordance with examples as disclosed herein.

FIG. 6 shows a flowchart illustrating a method or methods 600 that supports a barrier structure for preventing removal of, such as etching to, control circuitry in accordance with examples as disclosed herein. The operations of method 600 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 605, the method may include forming a metal layer over a first material formed over control circuitry. The operations of 605 may be performed in accordance with examples as described herein.

At 610, the method may include forming a second layer of a second material over the metal layer. The operations of 610 may be performed in accordance with examples as described herein.

At 615, the method may include removing a first cavity through the metal layer and the second layer to the first material to form a first contact region including a first portion of the metal layer and a first portion of the second layer and to form a second contact region including a second portion of the metal layer and a second portion of the second layer. The operations of 615 may be performed in accordance with examples as described herein.

At 620, the method may include depositing a barrier material in the first cavity. The operations of 620 may be performed in accordance with examples as described herein.

At 625, the method may include forming a stack of layers over the barrier material and the second layer. The operations of 625 may be performed in accordance with examples as described herein.

At 630, the method may include removing a second cavity through the stack of layers and at least a portion of the first contact region, where the barrier material prevents the second cavity from extending to the first material. The operations of 630 may be performed in accordance with examples as described herein.

At 635, the method may include depositing a third material in the second cavity. The operations of 635 may be performed in accordance with examples as described herein.

In some examples, an apparatus (e.g., a manufacturing system) as described herein may perform a method or methods, such as the method 600. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 1: A method or apparatus including operations, features, circuitry, logic, means, or instructions, or any combination thereof for forming a metal layer over a first material formed over control circuitry; forming a second layer of a second material over the metal layer; removing (e.g., by etching or other techniques) a first cavity through the metal layer and the second layer to the first material to form a first contact region including a first portion of the metal layer and a first portion of the second layer and to form a second contact region including a second portion of the metal layer and a second portion of the second layer; depositing a barrier material in the first cavity; forming a stack of layers over the barrier material and the second layer; removing (e.g., by etching or other techniques) a second cavity through the stack of layers and at least a portion of the first contact region, where the barrier material prevents the second cavity from extending to the first material; and depositing a third material in the second cavity.

Aspect 2: The method or apparatus of aspect 1, where the barrier material forms a liner over the first material and between the first contact region and the second contact region, the method or apparatus further including operations, features, circuitry, logic, means, or instructions, or any combination thereof for depositing a dielectric material over the liner to fill in the first cavity.

Aspect 3: The method or apparatus of any of aspects 1 and 2, further including operations, features, circuitry, logic, means, or instructions, or any combination thereof for determining a thickness of the barrier material for forming the liner based at least in part on a distance between the first contact region and the second contact region, where depositing the barrier material in the first cavity is based at least in part on determining the thickness.

Aspect 4: The method or apparatus of aspect 1, where the barrier material fills an entirety of the first cavity.

Aspect 5: The method or apparatus of any of aspects 1 through 4, further including operations, features, circuitry, logic, means, or instructions, or any combination thereof for planarizing the barrier material and the second layer before forming the stack of layers.

It should be noted that the described methods include possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 6: An apparatus, including: a substrate; control circuitry over the substrate and for accessing a memory array; a first contact region and a second contact region each including a metal material for coupling (e.g., configured to couple with) the control circuitry; a first material between the control circuitry and the metal material of the first contact region and the second contact region; and a barrier region located between the first contact region and the second contact region, the barrier region including a second material for preventing a removal (e.g., an etch) at least partially between the first contact region and the second contact region from extending to the control circuitry.

Aspect 7: The apparatus of aspect 6, further including: a stack of layers over the barrier region and the first contact region, the stack of layers associated with the memory array; and a conductive pillar extending through the stack of layers and into the first contact region, the conductive pillar located in an area at least partially between the first contact region and the second contact region that has been removed (e.g., etched).

Aspect 8: The apparatus of any of aspects 6 and 7, where the conductive pillar is in contact with the second material of the barrier region based at least in part on the second material being for preventing the removal (e.g., etch).

Aspect 9: The apparatus of aspect 6, further including: a stack of layers over the barrier region and the first contact region, the stack of layers associated with the memory array; and a dielectric material extending through the stack of layers and into the first contact region, the dielectric material located in an area at least partially between the first contact region and the second contact region that has been removed (e.g., etched).

Aspect 10: The apparatus of aspect 9, where the dielectric material is in contact with the second material of the barrier region based at least in part on the second material being for preventing the removal (e.g., etch).

Aspect 11: The apparatus of any of aspects 6 through 10, where the first contact region and the second contact region each include a polymer over the metal material, an oxide material over the metal material, or a combination thereof.

Aspect 12: The apparatus of any of aspects 6 through 11, where the second material fills an entirety of the barrier region.

Aspect 13: The apparatus of any of aspects 6 through 11, where: the barrier region includes a dielectric material, and the second material forms a liner between the dielectric material and the respective contact regions.

Aspect 14: The apparatus of any of aspects 6 through 13, where the second material of the barrier region is in contact with the metal material of the first contact region and the second contact region.

Aspect 15: The apparatus of any of aspects 6 through 14, where the second material of the barrier region includes a transition metal oxide, hafnium oxide, carbon doped silicon nitride, or hafnium silicate.

Aspect 16: The apparatus of any of aspects 6 through 15, where the control circuitry includes CMOS circuitry, the metal material includes tungsten silicide, the first material includes carbon doped nitride, or a combination thereof.

An apparatus is described. The following provides an overview of aspects of the apparatus as described herein:

Aspect 17: An apparatus, including: a substrate; control circuitry over the substrate and for accessing a memory array; a first material over the control circuitry; a metal material over the first material, the metal material including a first contact configured to couple with the control circuitry and a second contact for coupling with the control circuitry; a second material over the first contact and the second contact; and a barrier material between the first contact, the second contact, and the second material, the barrier material for preventing a removal (e.g., an etch) between the first contact and the second contact from extending to the control circuitry.

Aspect 18: The apparatus of aspect 17, where the barrier material is positioned between the first contact, the second contact, and the second material.

Aspect 19: The apparatus of any of aspects 17 and 18, further including: a dielectric material between the first contact, the second contact, and the second material, where the barrier material is positioned between the dielectric material and the first contact, the second contact, and the second material.

Aspect 20: The apparatus of any of aspects 17 through 19, where the barrier material is in contact with the first contact, the second contact, and the second material.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials, or combinations thereof. In some examples, one layer or level may be composed of two or more sublayers or sublevels.

The terms "if," "when," "based on," or "based at least in part on" may be used interchangeably. In some examples, if the terms "if" "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally, or alternatively (e.g., in an alternative example), be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a substrate;
   control circuitry over the substrate and for accessing a memory array;
   a first contact region and a second contact region each comprising a metal material for coupling with the control circuitry;
   a first material between the control circuitry and the metal material of the first contact region and the second contact region; and
   a barrier region located between the first contact region and the second contact region, the barrier region comprising a second material for preventing a removal at least partially between the first contact region and the second contact region from extending to the control circuitry.

2. The apparatus of claim 1, further comprising:
   a stack of layers over the barrier region and the first contact region, the stack of layers associated with the memory array; and
   a conductive pillar extending through the stack of layers and into the first contact region, the conductive pillar located in an area at least partially between the first contact region and the second contact region that has been removed.

3. The apparatus of claim 2, wherein the conductive pillar is in contact with the second material of the barrier region based at least in part on the second material being for preventing the removal.

4. The apparatus of claim 1, further comprising:
   a stack of layers over the barrier region and the first contact region, the stack of layers associated with the memory array; and
   a dielectric material extending through the stack of layers and into the first contact region, the dielectric material located in an area at least partially between the first contact region and the second contact region that has been removed.

5. The apparatus of claim 4, wherein the dielectric material is in contact with the second material of the barrier region based at least in part on the second material being for preventing the removal.

6. The apparatus of claim 1, wherein the first contact region and the second contact region each comprise a polymer over the metal material, an oxide material over the metal material, or a combination thereof.

7. The apparatus of claim 1, wherein the second material fills an entirety of the barrier region.

8. The apparatus of claim 1, wherein:
the barrier region comprises a dielectric material, and
the second material forms a liner between the dielectric material and the first contact region and the second contact region.

9. The apparatus of claim 1, wherein the second material of the barrier region is in contact with the metal material of the first contact region and the second contact region.

10. The apparatus of claim 1, wherein the second material of the barrier region comprises a transition metal oxide, hafnium oxide, carbon doped silicon nitride, or hafnium silicate.

11. The apparatus of claim 1, wherein the control circuitry comprises complementary metal oxide semiconductor (CMOS) circuitry, the metal material comprises tungsten silicide, the first material comprises carbon doped nitride, or a combination thereof.

12. An apparatus, comprising:
a substrate;
control circuitry over the substrate and for accessing a memory array;
a first material over the control circuitry;
a metal material over the first material, the metal material comprising a first contact configured to couple with the control circuitry and a second contact for coupling with the control circuitry;
a second material over the first contact and the second contact; and
a barrier material between the first contact, the second contact, and the second material, the barrier material for preventing a removal between the first contact and the second contact from extending to the control circuitry.

13. The apparatus of claim 12, wherein the barrier material is positioned between the first contact, the second contact, and the second material.

14. The apparatus of claim 12, further comprising:
a dielectric material between the first contact, the second contact, and the second material, wherein the barrier material is positioned between the dielectric material and the first contact, the second contact, and the second material.

15. The apparatus of claim 12, wherein the barrier material is in contact with the first contact, the second contact, and the second material.

16. The apparatus of claim 14, wherein the dielectric material is in contact with the barrier material based at least in part on the second material being for preventing the removal.

17. The apparatus of claim 12, wherein the first contact and the second contact each comprise a polymer over the metal material, an oxide material over the metal material, or a combination thereof.

18. The apparatus of claim 12, wherein:
the barrier material comprises a dielectric material.

19. The apparatus of claim 12, wherein the barrier material comprises a transition metal oxide, hafnium oxide, carbon doped silicon nitride, or hafnium silicate.

20. The apparatus of claim 12, wherein the control circuitry comprises complementary metal oxide semiconductor (CMOS) circuitry, the metal material comprises tungsten silicide, the first material comprises carbon doped nitride, or a combination thereof.

* * * * *